United States Patent [19]

Lew et al.

[11] Patent Number: 5,417,118
[45] Date of Patent: May 23, 1995

[54] MAGNETIC FLOWMETER DETERMINING FLOW RATE FROM PHASE ANGLE DIFFERENCE

[76] Inventors: Hyok S. Lew; Yon S. Lew; Yon K. Lew, all of 7890 Oak St., Arvada, Colo. 80005

[21] Appl. No.: 110,804

[22] Filed: Aug. 23, 1993

Related U.S. Application Data

[63] Continuation-in-part of Ser. No. 91,269, Jul. 15, 1993.

[51] Int. Cl.⁶ .............................................. G01F 1/60
[52] U.S. Cl. ................... 73/861.12; 73/861.15
[58] Field of Search ........... 73/861.11, 861.12, 861.15, 73/861.16, 861.17

[56] References Cited

U.S. PATENT DOCUMENTS 4,015,471  4/1977  Marsh ............................... 73/861.15
4,106,337  8/1978  Trietly, Jr. ........................ 73/861.16

Primary Examiner—Herbert Goldstein

[57] ABSTRACT

A magnetic flowmeter provides a first alternating electrical signal with at least a portion thereof comprising a first electromotive force generated by an electromagnetic interaction between an alternating magnetic field and the velocity of an electrically conductive fluid moving transversely across the alternating magnetic field, wherein the first electromotive force varies as a function of the velocity of the electrically conductive fluid, and a second alternating electrical signal with at least a portion thereof comprising a second electromotive force generated by an electromagnetic induction from the alternating magnetic field and other ambient electromagnetic field, wherein the second electromotive force is independent of the velocity of the electrically conductive fluid, and determines the velocity of the electrically conductive fluid as a function of a phase angle difference between the first and second alternating electrical signals.

20 Claims, 3 Drawing Sheets

MAGNETIC FLOWMETER DETERMINING FLOW RATE FROM PHASE ANGLE DIFFERENCE

This patent application is a Continuation-In-Part to patent application entitled "Phase Detection Method for Flow Measurement and Other Applications" filed on Jul. 15, 1993, Ser. No. 091,269, that discloses a method for operating a magnetic flowmeter that determines the velocity of an electrically conductive fluid as a function of phase angle difference between two alternating electrical signals generated by the dynamic electromagnetic interaction between the moving fluid and an alternating magnetic field and by the static electromagnetic induction from the alternating magnetic field. The present patent application discloses a generalized version of the method and structures disclosed in the parent patent application.

FIELD OF THE INVENTION

This invention relates to a method for operating a magnetic flowmeter and the construction of the magnetic flowmeters particularly suited to execute the method that determines the velocity or volume flow rate of an electrically conductive fluid as a function of phase angle difference between two alternating electrical signals generated by the dynamic electromagnetic interaction between the moving electrically conductive fluid and an alternating magnetic field and by the static electromagnetic induction from the alternating magnetic field.

BACKGROUND OF INVENTION

With few exceptions, all of the existing versions of the magnetic flowmeters measure the amplitude of an electromotive force resulting from the dynamic electromagnetic interaction between the moving electrically conductive fluid and an alternating magnetic field, and determine the velocity of the fluid as a function of the measured amplitude of the electromotive force. Generally, the electromotive force generated by the dynamic electromagnetic interaction between the moving electrically conductive fluid and the alternating magnetic field includes the noise signal such as the electromotive force generated by the static electromagnetic induction from the alternating magnetic field and other ambient electromagnetic fields, and consequently, it requires a complex and expensive electronic conditioning of the electrical signal under the amplitude measurement before determining the fluid velocity from the amplitude of the electromotive force. An earlier invention made by these inventors disclosed in a patent application "Phase Detection Method for Flowmeters and Other Applications" teaches a method that determines the velocity of an electrically conductive fluid moving transversely across an alternating magnetic field as a function of phase angle difference between two alternating electrical signals generated by the dynamic electromagnetic interaction between the moving electrically conductive fluid and the alternating magnetic field and by the static electromagnetic induction from the alternating magnetic field, wherein the noise signals included in the two alternating electrical signals become excluded when the phase angle difference between the two alternating electrical signals is taken as a measure of the velocity of the electrically conductive fluid. The present invention discloses the generalized version of the method for and universal principles of operating a magnetic flowmeter that determines the velocity of an electrically conductive fluid as a fuction of phase angle difference between two alternating electrical signals generated by the dynamic and static electromagnetic inductions, and the construction of the magnetic flowmeters that execute the method of phase angle difference in measuring the velocity or volume flow rate of an electrically conductive fluid. In conclusion, the present invention provides a new generation magnetic flowmeter that measures the flow rate of electrically conductive fluids with a much greater accuracy and. reliability, and yet costs much less compared with the existing versions of the magnetic flowmeters.

BRIEF SUMMARY OF INVENTION

The primary object of the present invention is to provide a method for determining the velocity or volume flow rate of an electrically conductive fluid moving transversely across an alternating magnetic field as a function of a phase angle difference between two alternating electrical signals generated as a result of dynamic and static electromagnetic induction between the alternating magnetic field and two electric circuits respectively providing the two alternating electrical signals, wherein the two alternating electrical signals include combinations of a dynamically induced electromotive force varying as a function of the fluid velocity and statically induced electromotive force constituting the noise signal independent of the fluid velocity with different constituency ratios.

Another object is to provide a magnetic flowmeter including two pairs of electrodes having different separation distances between the pair of electrodes included in each of the two pairs of electrodes, which pair of electrodes straddle the alternating magnetic field and the electrically conductive fluid moving in a direction generally perpendicular to the alternating magnetic field, that determines the velocity of the electrically conductive fluid as a function of phase angle difference between two electromotive forces respectively induced across the two pairs of electrodes.

A further object is to provide a magnetic flowmeter that determines the fluid velocity as a function of the phase angle difference between a first alternating electrical signal taken off from the alternating electric current energizing the electromagnets producing the alternating magnetic field, and a second alternating electrical signal generated by an alternating electromotive force induced across a pair of electrodes straddling the alternating magnetic field and the moving fluid.

Yet another object is to provide a magnetic flowmeter that determines the fluid velocity as a function of phase angle difference between two alternating electrical signals respectively provided by a pair of electrodes straddling the alternating magnetic field and the moving fluid, and by an inductive electric circuit element under a mutual induction with the electrical coils energizing the electromagnets which produce the alternating magnetic field.

Yet a further object is to provide a mgnetic flowmeter that determines the fluid velocity as a function of phase angle difference between two alternating electrical signals respectively provided by a first pair of electrodes straddling the alternating magnetic field and the moving fluid, and by a combination of a second pair of electrodes straddling the alternating magnetic field and the moving fluid, and an inductive electric circuit element under a mutual induction with the electrical coils generating the alternating magnetic field.

Still another object is to provide a magnetic flowmeter that determines the fluid velocity as a function of phase angle difference between two alternating electrical signals respectively provided by two electric circuits, wherein the first of the two electric circuits comprises a pair of electrodes straddling the alternating magnetic field and the moving fluid, and the second of the two electric circuits comprises the same pair of electrodes and an inductive circuit element under a mutual induction with the electrical coils generating the alternating magnetic field.

These and other objects of the present invention will become further clear as the description of the inventions progresses.

BRIEF DESCRIPTION OF FIGURES

The present invention may be described with a greater clarity and specificity by referring to the following figures.

PRINCIPLES OF OPERATION

Figure 1:
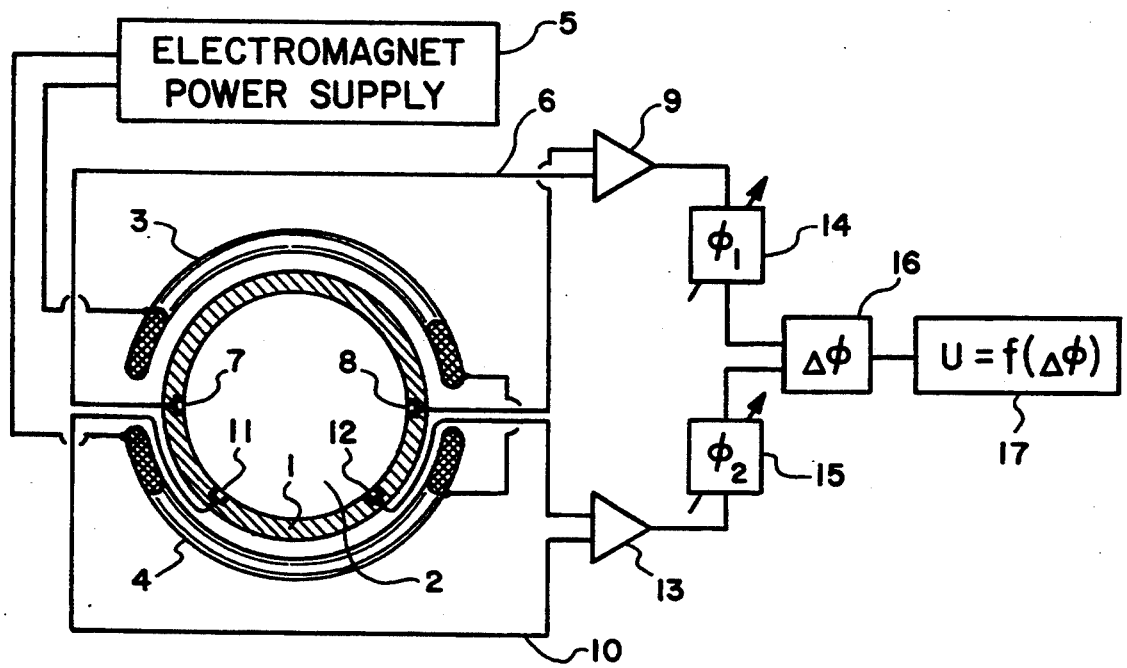
FIG. 1 illustrates an embodiment of the magnetic flowmeter that determines the fluid velocity as a function of phase angle difference between two alternating electromotive forces respectively induced across two pairs of electrodes having different separation distances between the pair of electrodes included in each of the two pairs of electrodes.

It is well known fact that a dynamic electromagnetic induction between the motion of an electrically conductive fluid and a magnetic field imposed transversely to the direction of motion of the fluid generates an electromotive force $E_D$ of an amplitude proportional to the fluid velocity U times the intensity of the magnetic field B across a pair of electrodes disposed within the magnetic field and separated from one another by the electrically conductive field, $$E_D = \alpha S U B, \tag{1}$$

where $\alpha$ is a constant of proportionality and S is the projected value of the distance of separation between the pair of electrodes projected onto a plane perpendicular to the fluid velocity as well as to the magnetic field. The static electromagnetic induction between the electric circuit comprising the pair of electrodes and the time rate of change of the magnetic field generates an electromotive force $E_S$ of an amplitude proportional to the time rate of change of the magnetic field, $$E_S = \beta \frac{dB}{dt}, \tag{2}$$

where $\beta$ is a constant of proportionality and t is the time. As a consequence, an electromotive force measured across the extremities of two lead wires respectively extending from the pair of electrodes comprises a combination of a flow-generated electromotive force or flow signal and a noise-generated signal or noise, and is equal to the sum of equation (1) and equation (2), $$E = \alpha S U B + \beta \frac{dB}{dt}. \tag{3}$$

Two electromotive forces respectively induced in two electric circuits, one comprising a pair of electrodes and the other comprising at least one of the two circuit elements, a pair of electrodes and an inductive circuit element such as an induction coil disposed within an alternating magnetic field that is generated by a single or a plurality of electromagnets energized by an alternating electric current of harmonic wave form, are given by equations $$E_i = \alpha_i S_i U \cos \omega t + \beta_i \omega \sin \omega t, \quad i = 1 \text{ and } 2, \tag{4}$$

where $\omega$ is the circular frequency of oscillation of the alternating magnetic field. Equation (4) can be written in the following form:

$$E_i = A_i \cos(\omega t - \Phi_i), \quad i = 1 \text{ and } 2, \tag{5}$$

where $A_i$ is the amplitude of the alternating electrical signal and $\Phi_i$ is the phase angle of the alternating electrical signal, which are defined by equations $$A_i = \sqrt{(\alpha_i S_i U)^2 + (\beta_i \omega)^2}, \quad i = 1 \text{ and } 2, \tag{6}$$

and $$\tan \phi_i = \frac{\beta_i \omega}{\alpha_i S_i U}, \quad i = 1 \text{ and } 2. \tag{7}$$

When use of the subtraction formula of the trigonometric function is made, equation (7) yields equation $$\tan(\phi_1 - \phi_2) = \frac{U}{\omega} \frac{K_1 - K_2}{(U/\omega)^2 + K_1 K_2}, \quad (8)$$

where $$K_i = \frac{\beta_i}{\alpha_i S_i}, \quad i = 1 \text{ and } 2. \quad (9)$$

It should be noticed that $K_i$ are constants intrinsic to the structural arrangements of the two electric circuits respectively providing the two alternating electrical signals given by equations (4) or (5). Equation (8) can be easily solved for the fluid velocity U, that is given by equation $$U = \omega \frac{(K_1 - K_2) \pm \sqrt{(K_1 - K_2)^2 - 4K_1 K_2 \tan^2 \Delta\phi}}{2\tan\Delta\phi}, \quad (10)$$

where $\Delta\Phi = (\Phi_1 - \Phi_2)$ is the phase angle difference between the two alternating electrical signals. When the phase angle difference is less than 15 degrees, equation (10) can be approximated by equation $$U = C\omega \tan \Delta\Phi, \quad (11)$$

where $$C = \frac{K_1 K_2}{K_1 - K_2}. \quad (12)$$

The constant of proportionality C is determined by calibrating the magnetic flowmeter. When the phase angle difference is less than 5 degrees, equation (10) can be approximated by equation $$U = C\omega\Delta\Phi. \quad (13)$$

The equations (10), (11) and (13) define the phase angle method for determining the velocity or volume flow rate of an electrically conductive fluid by using a magnetic flowmeter, which method can be summarized as follows: A magnetic flowmeter has two electric circuits respectively providing two alternating electrical signals comprising combinations of first alternating electromotive force generated by the dynamic induction and a second alternating electromotive force generated by the static induction with different constituency ratios, and the fluid velocity is determined as a function of phase angle difference between the two alternating electrical signals by using a mathematical relationship given by equation (10), (11) or (13), or an empirical equivalent thereof. It should be understood that the electromagnets generating the alternating magnetic field that dynamically interacts with the moving electrically conductive fluid, can be energized by alternating electric currents of other wave forms such as the wave shape of rectangular, saw tooth or trapezoidal, or any other preferred geometry.

DESCRIPTION OF ILLUSTRATED EMBODIMENTS

In FIG. 1 there is illustrated a cross section of an embodiment of the magnetic flowmeter that determines the fluid velocity as a function of phase angle difference between two alternating electrical signals. The conduit 1 ides a flow passage 2, and the electromagnets 3 and 4 provide an alternating magnetic field in directions generally perpendicular to the direction of fluid flow, which electromagnets are energized by an alternating electric current supplied by the electromagnet power supply 5. A first electric circuit 6 providing a first alternating electrical signal comprises a first pair of electrodes 7 and 8 disposed within the alternating magnetic field on a line transverse to the flux lines of the alternating magnetic field as well as to the velocity of the fluid and straddles a volume of the fluid, and an amplifier or an amplifier-filter 9. A second electric circuit 10 providing a second alternating electrical signal comprises a second pair of electrodes 11 and 12 disposed within the alternating magnetic field, and an amplifier or an amplifier-filter 13. Each two electrodes included in each of the two pairs of electrodes are respectively secured to two opposite portions of the wall of the conduit 1, wherein the line connecting the pair of electrodes crosses transversely the flux lines of the alternating magnetic field. The electrodes may be disposed on a single cross section or on different cross sections of the conduit 1 in an arrangement wherein the individual electrode is exposed to or electrically insulated from the fluid moving through the flow passage 2. It should be noticed that value of the separation distance between each pair of electrodes of the two pairs of electrodes 7-8 and 11-12 projected on a line perpendicular to the direction of fluid flow as well as to the alternating magnetic field has two different magnitudes for the two pairs of electrodes 7-8 and 11-12. One or both of the two electric circuits 6 and 10 may include an artificial phase angle imposing device 14 and/or 15, each of which may comprise a combination of a variable resistor and a capacitor element or inductor element. A data processing device 16 measures the phase angle difference $\Delta\Phi$ between the two alternating electrical signals respectively provided by the two electric circuits 6 and 10, and a data analyzing device 17 determines the fluid velocity or volume flow rate of fluid as a function of the phase angle difference. It should be understood that a major portion of the first alternating electrical signal comprises the flow-generated signal and a minor portion of the first alternating electrical signal comprises the noise-generated signal, while the second alternating electrical signal comprises the flow-generated signal and the noise-generated signal in a composition ratio opposite to that of the first alternating electrical signal. The artificial phase angle imposing device 14 and/or 15 may be used to set the zero value of the phase angle difference in such a way that the measured phase angle $\Delta\Phi$ by the data processing device 16 becomes zero when the fluid velocity is equal to zero. The phase angle difference $\Delta\Phi$ can be determined by counting the number of pulses of a known frequency occurring in a time interval between zero-crossings of the two alternating electrical signals, or by taking the ratio of such a number of pulses to the number of pulses occurring during one full period of one of the two alternating electrical signals. An alternative method for determining the phase angle difference $\Delta\Phi$ is described in conjunction with FIG. 2.

Figure 2:
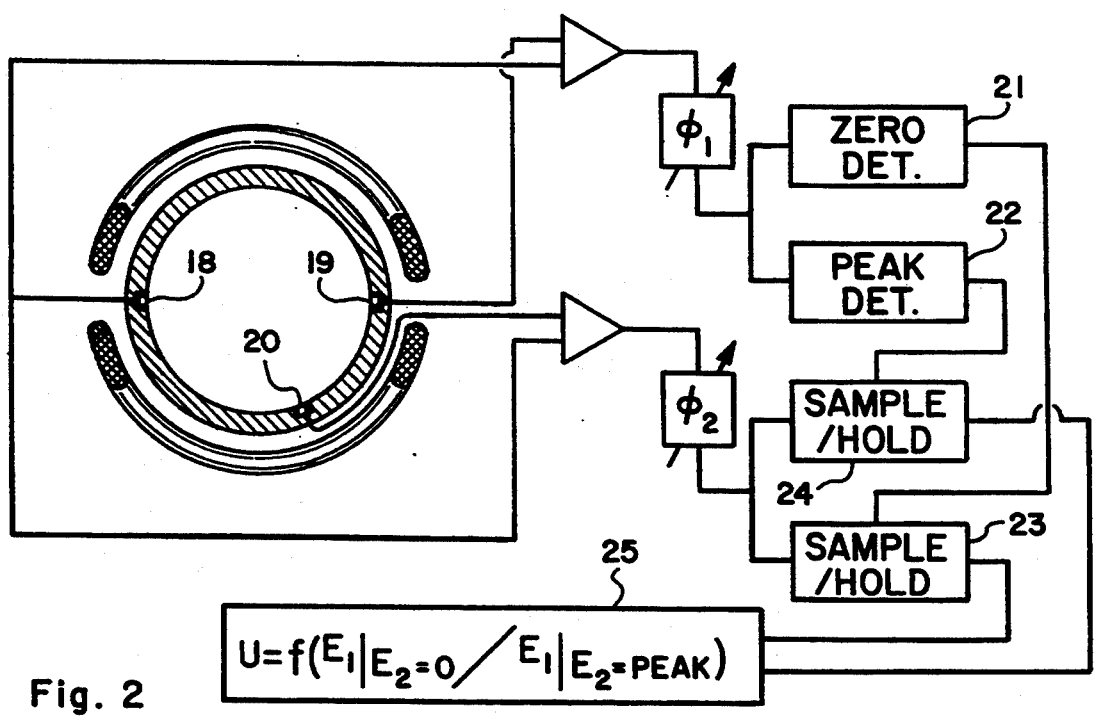
FIG. 2 illustrates a modified version of the embodiment shown in FIG. 1, wherein the two pairs of electrodes share a common electrode.

In FIG. 2 there is illustrated a modified version of the embodiment shown in FIG. 1. In this embodiment, the two pairs of electrodes 18-19 and 19-20 respectively included in the two electric circuits providing the two alternating electrical signals possess a common electrode 19. Of course, the projected separation distance taken along a line perpendicular to the flow velocity as well as to the flux lines of the alternating magnetic field between each pair of electrodes has different values for the two pairs of electrodes 18-19 and 19-20. The phase angle measuring device employed in this particular illustrative embodiment comprises zero-detector 21 and peak-detector 22 respectively finding the instants when one of the two alternating electrical signals reaches a zero value and a peak value, and two sample-hold devices 23 and 24 respectively measuring values of the second of the two alternating electrical signals at two instants when the one of the two alternating electrical signals reaches a zero value and a peak value, respectively. It can be readily shown that the ratio of the afore-mentioned two values of the other of the two alternating electrical signals is equal to the tangent of the phase angle difference $\Delta\Phi$. A data analyzer 25 determines the fluid velocity as a function of a ratio between the two values of the second of the two alternating electrical signals respectively measured at two instants when the first of the two alternating electrical signals reaches a zero value and peak value, respectively. Of course, in an alternative embodiments, the fluid velocity can be determined as a function of the phase angle difference $\Delta\Phi$ determined by the method described in conjunction with FIG. 1.

Figure 3:
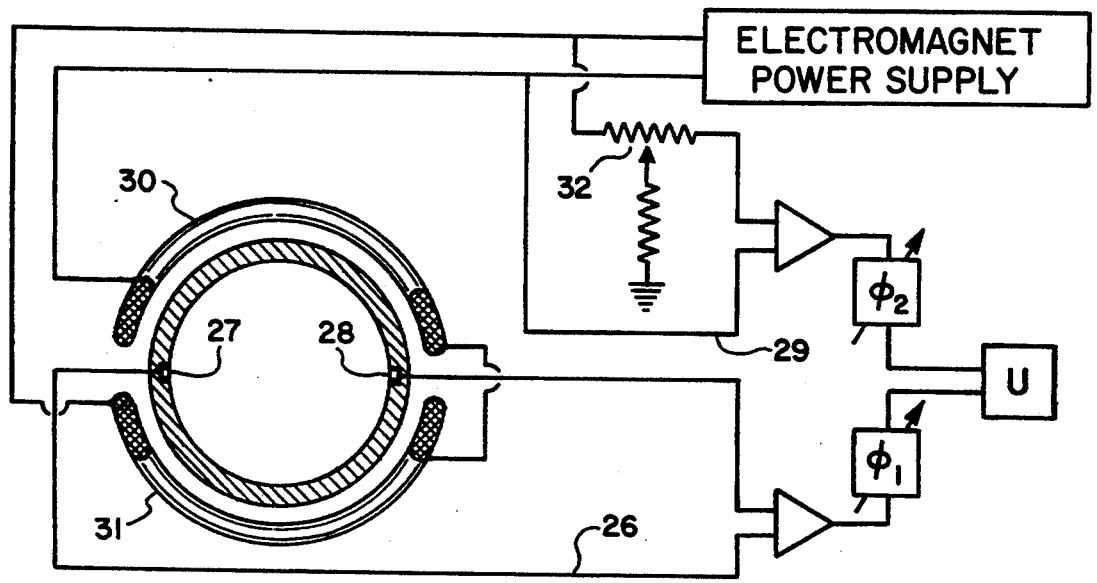
FIG. 3 illustrates another embodiment of the magnetic flowmeter that determines the fluid velocity as a function of phase angle difference between two alternating electrical signals respectively provided by a pair of electrodes and by an alternating electric current energizing the electrical coils generating the alternating magnetic field.

In FIG. 3 there is illustrated a cross section of another embodiment of the magnetic flowmeter that determines the fluid velocity as a function of phase angle difference between two alternating electrical signals. In this embodiment, the first of the two alternating electrical signals is provided by a first electric circuit 26 comprising a pair of electrodes 27-28, while the second electric circuit 29 tapping the alternating electric current energizing .the electromagnets 30 and 31 provides the second of the two alternating electrical signals. The variable resistor 32 included in the second electric circuit 29 is used to set the amplitude of the second alternating electrical signal taken off from the alternating electric current energizing the electromagnets 30 and 31 to a suitable level. It is obvious that the first alternating electrical signal comprises mostly the flow-generated signal associated with the motion of the electrically conductive fluid, while the second alternating electrical signal comprises mostly the noise-generated signal associated with the static electromagnetic induction from the alternating magnetic field.

Figure 4:
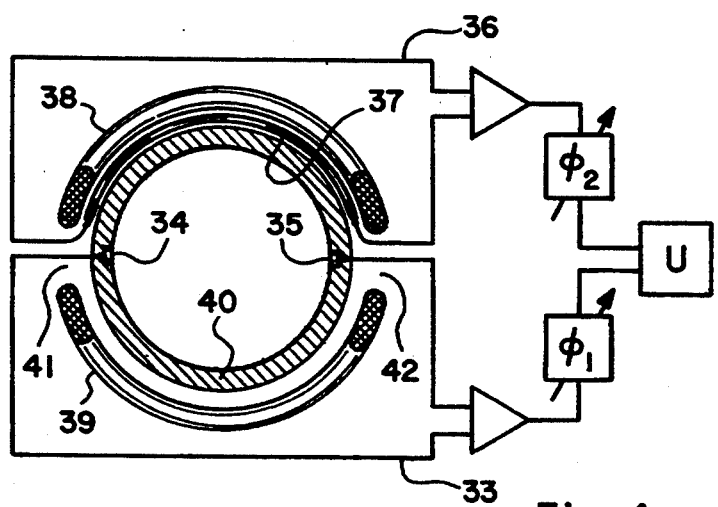
FIG. 4 illustrates a further embodiment of the magnetic flowmeter that determines the fluid velocity as a function of phase angle difference between two alternating electrical signals respectively provided by a pair of electrodes and an inductive circuit element under a mutual induction with the electrical coils generating the alternating magnetic field.

In FIG. 4 there is illustrated a cross section of a further embodiment of the magnetic flowmeter determining the fluid velocity as a function of phase angle difference between two alternating electrical signals respectively provided by a first electric circuit 33 including a pair of electrodes 34 and 35 and a second electric circuit 36 including an inductive circuit element 37 such as an induction coil disposed intermediate the two electromagnets 38 and 39 and exteriorly to the conduit 40. The inductive circuit element 37 may comprise a section of lead wire acting as an antenna or an induction coil with a loop opening, through which the flux lines of the alternating magnetic field extend. The two lead wires extending from the inductive element 37 may be routed respectively through the two opposite gaps 41 and 42 between the two electromagnets 38 and 39 as shown in the particular illustrative embodiment, or may extend from the same side thereof as shown in FIGS. 5 and 6.

It is clear that the first alternating electrical signal comprises mostly the flow-generated signal associated with the motion of the electrically conducting fluid, while the second alternating electrical signal comprises mostly the noise-generated signal associated the static electromagnetic induction from the alternating magnetic field.

Figure 5:
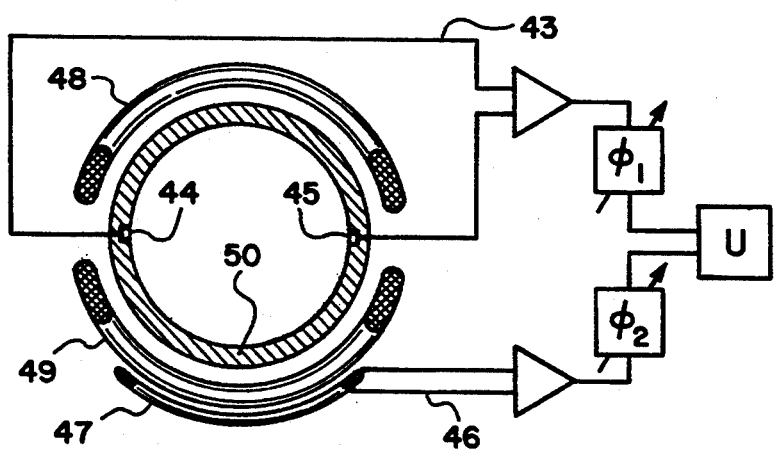
FIG. 5 illustrates a modified version of the embodiment shown in FIG. 4.

In FIG. 5 there is illustrated a modified version of the embodiment shown in FIG. 4. The first electric circuit 43 providing the first alternating electrical signal includes a pair of electrodes 44 and 45. The second alternating electrical signal is provided by the second electric circuit including an inductive circuit element 47 such as an induction coil disposed adjacent to one of the two electromagnets 48 and 49 and exteriorly to the conduit 50, which inductive circuit element plays the role of an antenna picking up the electromagnetic noise also picked up by the first electric circuit 43.

Figure 6:
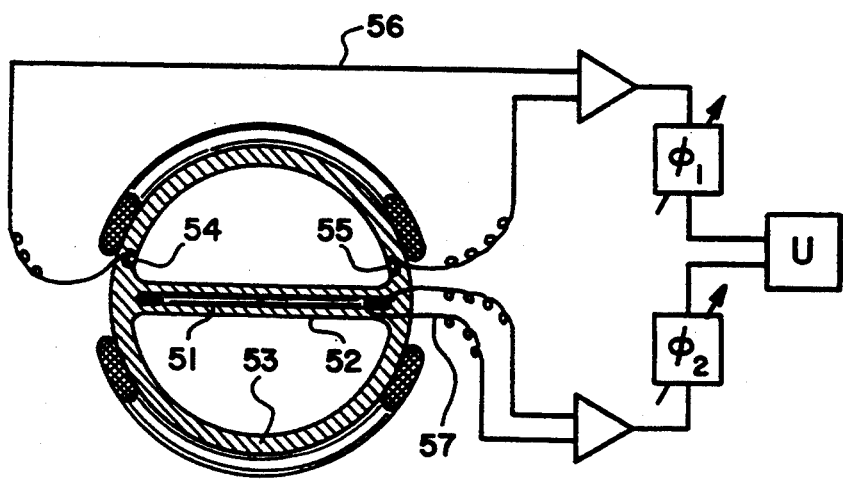
FIG. 6 illustrates another modified version of the embodiment shown in FIG. 4.

In FIG. 6 there is illustrated another modified version of the embodiment shown in FIG. 4. In this embodiment, the inductive circuit element 51 having a construction and function similar to the element 37 and 47 respectively included in the embodiments shown in FIGS. 4 and 5, is disposed within a planar flow divider 52 disposed parallel to the center line of the conduit intermediate the two electromagnets and extending across the flow passage provided by the conduit 53. This particular arrangement of the inductive circuit element 51 disposed on a plane generally parallel and closely adjacent to a line including the pair of electrodes 54 and 55 ensures that the two electric circuits 56 and 57 respectively providing the two alternating electrical signals pick up the common noise, which common noise becomes cancelled out in the process of obtaining the phase angle difference between the two alternating electrical signals.

Figure 7:
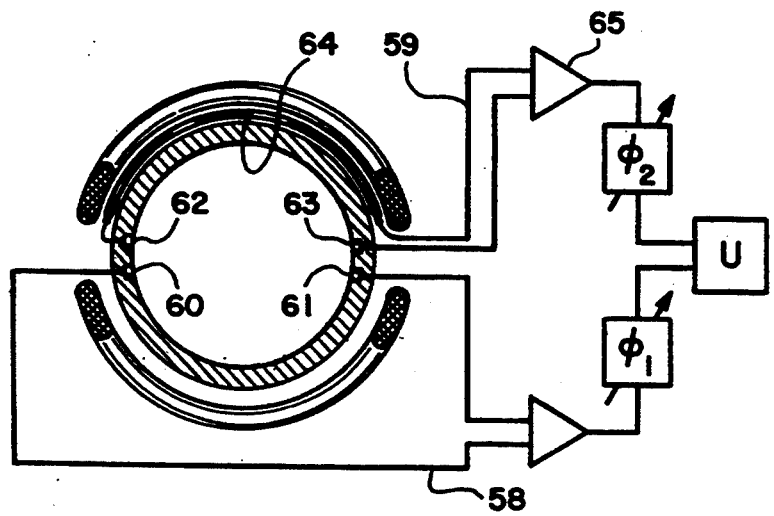
FIG. 7 illustrates yet another embodiment of the magnetic flowmeter that determines the fluid velocity as a function of phase angle difference between two alternating electrical signals respectively provided by a first pair of electrodes and by a combination of a second pair of electrodes and an inductive circuit element under a mutual induction with the electrical coils generating the alternating magnetic field.

In FIG. 7 there is illustrated a cross section of yet another embodiment of the magnetic flowmeter determining the fluid velocity as a function of phase angle difference between two alternating electrical signals respectively provided by two electric circuits 58 and 59. The first electric circuit 58 includes a pair of electrodes 60 and 61, while the second electric circuit 59 includes a pair of electrodes 62 and 63, and an inductive circuit element 64 having a construction and function similar to the inductive circuit elements 37, 47 and 51 respectively included in the embodiments shown in FIGS. 4, 5 and 6. It should be understood that the inductive circuit element 64 may be replaced with the type of inductive element 47 or 51 shown in FIGS. 5 and 6. It should be mentioned that, while the pair of electrodes 62-63 and the inductive circuit element 64 are included in the electric circuit 59 in a series arrangement in the particular illustrative embodiment, the electrodes 62-63 and the inductive circuit element 64 may be included in the electric circuit 59 in a parallel arrangement, wherein the two lead wires extending from the inductive circuit element 64 are respectively merged with the two lead wires respectively extending from the two electrodes 62 and 63, and the two merged combinations of lead wires are respectively connected to the two input terminals of the amplifier or an amplifier-filter 65. In this particular embodiment, the two pairs of the electrodes 60-61 and 62-63 may have the same or different separation distance between each pair of electrodes. It is clear that the first and second alternating electrical signals comprise the flow-generated signal and the noise-generated signal with different constituency ratios.

Figure 8:
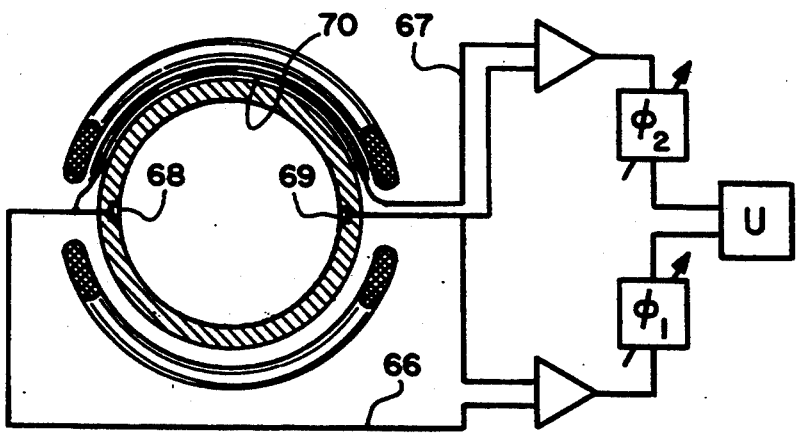
FIG. 8 illustrates yet a further embodiment of the magnetic flowmeter that determines the fluid velocity as a function of phase angle difference between two alternating electrical signals respectively provided by a pair of electrodes and by a combination of the same pair of electrodes and an inductive circuit element experiencing an electromagnetic induction from the alternating magnetic field.

In FIG. 8 there is illustrated a cross section of yet a further embodiment of the magnetic flowmeter that determines the fluid velocity as a function of phase angle difference between the two alternating electrical signals respectively provided by two electric circuits 66 and 67. The first electric circuit 66 includes a pair of electrodes 68 and 69, while the second electric circuit 67 includes the same pair of electrodes 68-69 and an inductive circuit element 70 in a series combination. It should be understood that the inductive circuit element 70 may be replaced with the type of inductive circuit element 47 or 51 shown in FIGS. 5 and 6. It should be mentioned that the various embodiments of the magnetic flowmeter operating on the method of the phase angle difference as taught by the present invention may employ different electronic data processing devices determining the phase angle difference such as those described in conjunction with FIGS. 1 and 2, or other types available at the present time or to become available in the future in the art of measuring phase angle difference between two alternating electrical signals.

While the principles of the inventions have now been made clear by the illustrative embodiments shown and described, there will be many modifications of the methods, structures, arrangements, proportions and materials, which are immediately obvious to those skilled in the art and particularly adapted to the specific working environments and operating conditions in the practice of the inventions without departing from those principles. It is not desired to limit the inventions to the particular illustrative embodiments shown and described, and accordingly, all suitable modifications and equivalents may be regarded as falling within the scope of the inventions as defined by the claims which follow.

The embodiments of the inventions, in which an exclusive property or privilege is claimed, are defined as follows:

1. A method for measuring velocity of an electrically conductive fluid moving through an alternating magnetic field in a direction transverse to flux lines of the alternating magnetic field, comprising in combination:
    a) obtaining a first alternating electrical signal occurring in a first electric circuit including a pair of electrodes disposed on a line transverse to the flux lines of the alternating magnetic field as well as to the velocity of the electrically conductive fluid and straddling a volume of the electrically conductive fluid;
    b) obtaining a second alternating electrical signal occurring in a second electric circuit including at least one of the following two circuit elements; a second pair of electrodes straddling a volume of the electrically conductive fluid and an inductive circuit element experiencing an electromagnetic induction from the alternating magnetic field; and
    c) determining velocity of the electrically conductive fluid as a function of a phase angle difference between the first and second alternating electrical signals.

2. A method as defined in claim 1 wherein the phase angle difference between the first and second alternating electrical signals is artificially adjusted in such a way that adjusted phase angle difference between the first and second alternating electrical signals becomes zero when the velocity of the electrically conductive fluid vanishes.

3. A method as defined in claim 1 wherein the second alternating electrical signal occurs in the second electric circuit including a second pair of electrodes, wherein separation distance between the pair of electrodes included in the first electric circuit is different from separation distance between the pair of electrodes included in the second electric circuit.

4. A method as defined in claim 1 wherein the second alternating electrical signal occurs in the second electric circuit includes the inductive circuit element without the second pair of electrodes.

5. A method as defined in claim 1 wherein one of the pair of electrodes included in the first electric circuit and one of the pair of electrodes included in the second electric circuit are common.

6. A method as defined in claim 1 wherein the pair of electrodes included in the first electric circuit and the pair of electrodes included in the second electric circuit are the same pair of electrodes.

7. A method for measuring velocity of an electrically conductive fluid moving through an alternating magnetic field in a direction transverse to flux lines of the alternating magnetic field, comprising in combination:
    a) obtaining a first alternating electrical signal occurring in a first electric circuit including a pair of electrodes disposed on a line transverse to the flux lines of the alternating magnetic field as well as to the velocity of the electrically conductive fluid and straddling a volume of the electrically conductive fluid;
    b) obtaining a second alternating electrical signal taken off from an alternating electric current energizing electromagnets producing the alternating magnetic field; and
    c) determining velocity of the electrically conductive fluid as a function of a phase angle difference between the first and second alternating electrical signals.

8. A method as defined in claim 7 wherein the phase angle difference between the first and second alternating electrical signals is artificially adjusted in such a way that adjusted phase angle difference between the first and second alternating electrical signals becomes zero when the velocity of the electrically conductive fluid vanishes.

9. An apparatus for measuring velocity of an electrically conductive fluid comprising in combination:
    a) a flow passage;
    b) means for producing an alternating magnetic field with flux lines transverse to the velocity of the electrically conductive fluid moving through the flow passage and extending across at least a cross section of the flow passage;
    c) means for generating a first alternating electrical signal with at least a portion thereof comprising a first alternating electromotive force generated by an electromagnetic interaction between the velocity of the electrically conductive fluid and the alternating magnetic field, said first alternating electromotive force varying as a function of the velocity of the electrically conductive fluid;
    d) means for generating a second alternating electrical signal with at least a portion thereof comprising a second alternating electromotive force generated by an electromagnetic induction from the alternating magnetic field, said second alternating electromotive force being substantially independent of the velocity of the electrically conductive fluid; and
    e) means for determining velocity of the electrically conductive fluid moving through the flow passage as a function of a phase angle difference between the first and second alternating electrical signals.

10. An apparatus as defined in claim 9 wherein said combination includes means for artificially adjusting the phase angle difference between the first and second alternating electrical signals in such a way that adjusted phase angle difference between the first and second alternating electrical signals becomes zero when the velocity of the electrically conductive fluid vanishes.

11. An apparatus as defined in claim 9 wherein the means for generating the first alternating electrical signal comprises a first electric circuit including a pair of electrodes disposed on a line transverse to the flux lines of the alternating magnetic field as well as to the velocity of the electrically conductive fluid and straddling a volume of the electrically conductive fluid moving through the flow passage, and the means for generating the second alternating electrical signal comprises a second electric circuit including at least one of the following two circuit elements; a second pair of electrodes straddling a volume of the electrically conductive fluid moving through the flow passage and an inductive circuit element experiencing an electromagnetic induction from the alternating magnetic field.

12. An apparatus as defined in claim 11 wherein the second electric circuit includes the second pair of electrodes, wherein separation distance between the pair of electrodes included in the first electric circuit is different from separation distance between the pair of electrodes included in the second electric circuit.

13. An apparatus as defined in claim 11 wherein the second electric circuit includes the inductive circuit element without the second pair of electrodes.

14. An apparatus as defined in claim 11 wherein one of the pair of electrodes included in the first electric circuit and one of the pair of electrodes included in the second electric circuit are common.

15. An apparatus as defined in claim 11 wherein the inductive circuit element included in the second electric circuit is disposed exteriorly to the flow passage.

16. An apparatus as defined in claim 11 wherein the inductive circuit element included in the second electric circuit is disposed within a planar member disposed parallel to direction of flow of the electrically conductive fluid and extending across a cross section of the flow passage.

17. An apparatus as defined in claim 11 wherein the pair of electrodes included in the first electric circuit and the second pair of electrodes included in the second electric circuit are separated from one another.

18. An apparatus as defined in claim 11 wherein the pair of the electrodes included in the first electric circuit and the second pair of electrodes included in the second electric circuit are the same pair of electrodes.

19. An apparatus as defined in claim 9 wherein the means for generating the first alternating electrical signal comprises a first electric circuit including a pair of electrodes disposed on a line transverse to the flux lines of the alternating magnetic field as well as to the velocity of the electrically conductive fluid and straddling a volume of the electrically conductive fluid moving through the flow passage, and the means for generating the second alternating electrical signal comprises a second electric circuit taking off an alternating electrical signal as the second alternating electrical signal from an alternating electric current energizing electromagnets constituting the means for producing the alternating magnetic field.

20. An apparatus as defined in claim 19 wherein said combination includes means for artificially adjusting the phase difference between the first and second alternating electrical signals in such a way that adjusted phase angle difference between the first and second alternating electrical signals becomes zero when the velocity of the electrically conductive fluid vanishes.

* * * * *